United States Patent [19]

Rittner

[11] 4,135,950
[45] Jan. 23, 1979

[54] RADIATION HARDENED SOLAR CELL

[75] Inventor: Edmund S. Rittner, Bethesda, Md.

[73] Assignee: Communications Satellite Corporation, Washington, D.C.

[21] Appl. No.: 790,630

[22] Filed: Apr. 25, 1977

Related U.S. Application Data

[63] Continuation-in-part of Ser. No. 615,633, Sep. 22, 1975, abandoned.

[51] Int. Cl.² .............................................. H01L 31/06
[52] U.S. Cl. ............................. 136/89 SJ; 136/89 CC
[58] Field of Search ......................... 136/89 CC, 89 SJ

[56] References Cited

U.S. PATENT DOCUMENTS

| | | | |
|---|---|---|---|
| 3,015,590 | 1/1962 | Fuller | 148/1.5 |
| 3,150,999 | 9/1964 | Rudenberg et al. | 136/89 |
| 3,278,337 | 10/1966 | Gault | 136/89 |

OTHER PUBLICATIONS

J. J. Cuomo et al., "Total Photon Absorption Solar Cells," IBM Tech. Disc. Bull., vol. 18, p. 935 (1975).
R. A. Arndt et al. "Optical Properties of the COMSAT Non-Reflective Cell," 11th IEEE Photovoltaic Specialists Conf., May 1975, pp. 40-43.
W. W. Lloyd, "Fabrication of an Improved Vertical Multijunction Solar Cell," 11th IEEE Photovoltaic Specialists' Conf., May 1975, pp. 349-355.
C. R. Baraona et al. "V-Grooved Silicon Solar Cells," 11th IEEE Photovoltaic Specialists' Conf., May 1975, pp.44-48.

*Primary Examiner*—John H. Mack
*Assistant Examiner*—Aaron Weisstuch
*Attorney, Agent, or Firm*—Sughrue, Rothwell, Mion, Zinn and Macpeak

[57] ABSTRACT

A radiation hardened junction solar cell is prepared by etching V-grooves in the surface of a semiconductor substrate. The overall thickness of the substrate and the depth of the V-grooves are chosen as functions of the diffusion length of the minority carriers in the substrate material at beginning of life and at end of life for a given design application. An opposite conductivity type layer is then formed over the V-grooved surface of the semiconductor substrate. The planar back surface of the solar cell is highly doped to convert it into a minority carrier reflecting region.

6 Claims, 2 Drawing Figures

RADIATION HARDENED SOLAR CELL

CROSS-REFERENCE TO RELATED APPLICATION

This application is a continuation-in-part application of my co-pending application Ser. No. 615,633 filed Sept. 22, 1975, now abandoned.

BACKGROUND OF THE INVENTION

The present invention generally relates to junction solar cells, and more particularly, to a radiation hardened structure for such solar cells producing an increase in both the beginning of life and end of life efficiencies for a given application.

All solar cells used in space applications suffer degradation as a result of bombardment by energetic electrons and protons trapped in the earth's magnetic field and by solar flare protons. Whereas some of the less energetic of the trapped protons may be shielded against by the cover slide, all of the other particles cause damage within the solar cell. This damage is in the form of defects in the crystal structure and has the effect of reducing the life time of minority carriers, thereby increasing the likelihood of recombination before the carriers reach the junction. Those photogenerated carriers which are not collected by the junction do not contribute to the photocurrent. This effect is most profound in cells made from highly doped substrates which would exhibit high voltage output. Therefore, current practice in the fabrication of junction solar cells is a trade-off between power output and radiation degradation. More specifically, the substrate is only modestly doped (to a resistivity between 2 and 10 $\Omega$cm in p-Si substrates), thus sacrificing beginning of life efficiency in order to keep end of life efficiency as high as possible.

SUMMARY OF THE INVENTION

According to the present invention, V-grooves are etched in the surface of a silicon substrate. The overall thickness of the substrate and the depth of the V-grooves are chosen as functions of the diffusion length of minority carriers in the semi-conductor substrate at the beginning of life and at the end of life for a given application. The junction may then be fabricated by diffusion or other appropriate processes such as are commonly employed in the art to render the V-grooved surface of opposite conductivity type to the substrate. The planar back surface is highly doped by any means known in the art to convert it into a minority carrier reflecting region. The front electrode in the form of fine metal lines is applied by vacuum evaporation through a mask or by other means well known in the art to the peaks between the adjacent V-grooves. The planar back surface may be optically polished, and the back electrode is applied over the back surface by means well known in the art. The addition of an antireflective coating to further reduce reflection losses and of a cover slide for radiation protection also follow well known arts.

BRIEF DESCRIPTION OF THE DRAWINGS

The specific nature of the invention as well as other objects, aspects, uses and advantages thereof will clearly appear from the following description anf from the accompanying drawing in which.

DESCRIPTION OF THE PREFERRED EMBODIMENT

Figure 1:
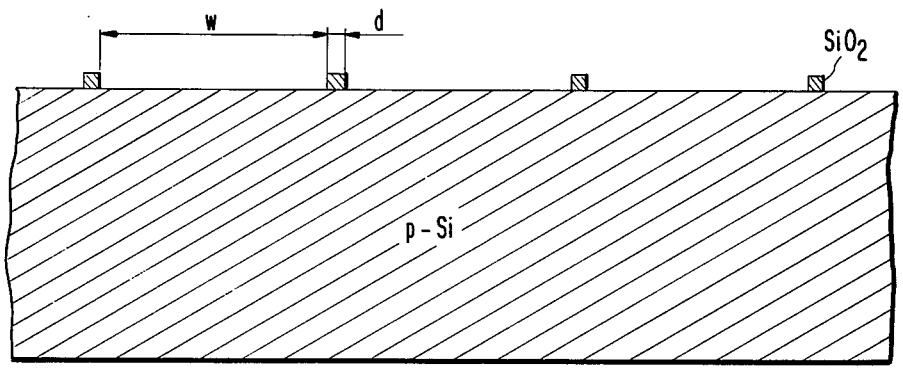
FIG. 1 is a cross-sectional view of a p-type silicon substrate prepared in an intermediate stage in the manufacture of a radiation hardened solar cell according to the present invention.

The invention will be described specifically for silicon solar cells, but it should be understood that the principles may be generally applied to solar cells made of other materials with appropriate changes in dimensions. A p-doped single crystal silicon substrate is the starting material. The crystal is cut along the <100> crystal plane. With the use of conventional photolithographic techniques and oxide masking, the surface is converted into the form shown in FIG. 1 where the oxide portions represent very narrow stripes running perpendicular to the plane of the drawing. The back surface is completely covered with oxide or some other method of protection against the etching solution is employed. A solution of hydrazine in water with a molar ratio of 1.14 to 1 of $N_2H_4/H_2O$ is employed at 100° C. to etch the top surface of the silicon substrate. Such an etching solution is described, for example, by T. J. Rogers and J. D. Meindl in *IEEE Transactions on Electron Devices*, March 1973, at page 226, and by D. B. Lee, "Anisotropic Etching of Silicon," Journal of Applied Physics, Vol. 40, No. 11, October, 1969, pages 4569 to 4574. The use of this etching solution on a silicon substrate exhibiting a <100> surface results in the unprotected portion of the silicon wafer being converted to V-grooves. The groove formation is self-stopping, with an angle of 70° and a depth to width ratio of 0.7. Without the oxide masking, the V-grooves would not be formed. Instead, the <100> surface of the silicon substrate subjected to the hydrazine etch would exhibit a random distribution of pyramids of base width between about 2 to 10 $\mu$m.

Figure 2:
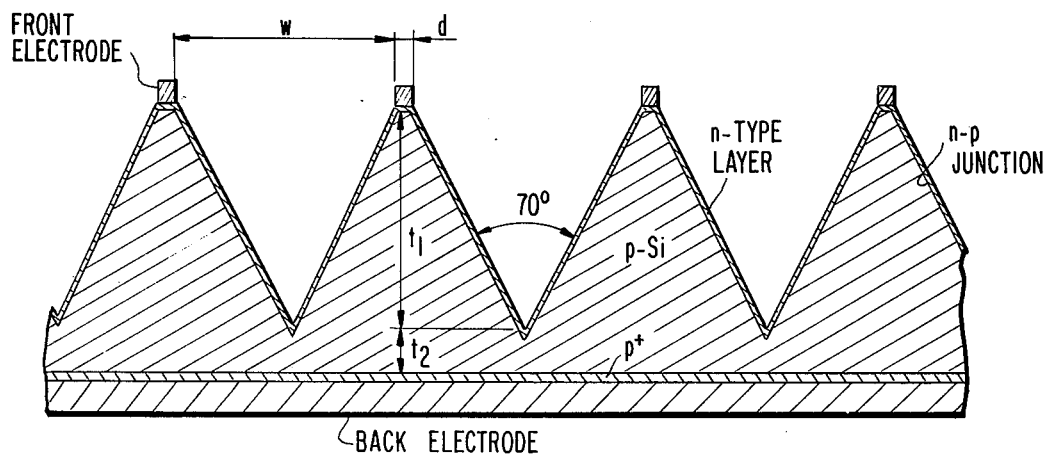
FIG. 2 is a cross-sectional view of a radiation hardened solar cell according to the present invention.

To complete the fabrication of the solar cell according to the present invention, all oxide masking is removed after the V-grooves have been formed. This is accomplished in any conventional manner. The back surface of the solar cell, which may be optically polished, is then converted to $p^+$ by any means known in the art such as, for example, diffusion of boron or aluminum to convert it into an electron reflecting region. Next, a thin n-type layer is diffused into the V-grooved surface of the p-type silicon substrate. A front electrode in the form of fine metal lines is applied to the peaks between the V-grooves. Thus, the front electrode occupies the position previously occupied by the oxide masking. Finally, the back electrode is applied over the back surface and the antireflective coating and cover slide are added. The resulting structure is shown in FIG. 2.

According to the present invention, the dimensions $t_1$, $t_2$ and $w$ are critical dimensions which optimize the power output of the solar cell throughout its design lifetime. The overall thickness $t_1 + t_2$ is made equal to the diffusion length of electrons in the p-material at beginning of life. For example, for a 2 $\Omega$cm p-type substrate material, the value of $t_1$ should be equal approximately to 320 $\mu$m. Since in accordance with the etching method for preparing the grooves, the groove depth to width ratio is 0.7, the groove width $w$ should be approximately 460 $\mu$m. The thickness $t_2$, i.e., the dimension from the valley of the V-groove to the planar back surface of the solar cell, is made equal to the diffusion length of electrons at the end of life corresponding to the intended space mission. Thus, for a geosynchronous mission of 7 years' duration, the value of $t_2$ should be approximately equal to 60 μm. For a 0.5 Ωcm p-type substrate material, the corresponding dimensions would be approximately 190 μm and 50 μm, respectively. See FIG. 3 on page 13 of my article entitled "Improved Theory of the Silicon p-n Junction solar Cell" published in the *Journal of Energy*, Vol. 1, pages 9 to 17 (January/February 1977), for a graph of diffusion lengths at beginning of life and end of life as a function of doping concentration. The required geometry is controlled by the dimensions of the oxide masking which controls the V-grooved structure and also by the initial thickness of the silicon substrate. The width $d$ of the oxide masking is much smaller than $w$ and just large enough for convenient contacting of the front electrode.

The doping of the back surface of the solar cell to make it $p^+$ is also an important condition of the invention. More specifically, it is necessary to satisfy the condition $s << D/L$, where $s$ is the surface recombination velocity at the back surface and D and L are the diffusion coefficient and diffusion length, respectively, of electrons in the p-type substrate. A complete treatment of this condition may be had by reference to my article entitled "Improved Theory of the Silicon p-n Junction Solar Cell" referenced above. Note especially equations 2 and 2a on page 9.

With the conditions that $t_1 + t_2$ be equal to the diffusion length of electrons at the beginning of life, $t_2$ be equal to the diffusion length of electrons at the end of life, and $s << D/L$, the solar cell according to the present invention has a high initial efficiency and unusually high radiation hardness. While there is a small decrease in short-circuit current because of radiation-induced decrease in electron life time in the p-type substrate, the large open-circuit voltage degradation suffered by conventional solar cells is absent in the solar cell according to this invention. The latter circumstance is a consequence of the fact that as long as the condition at the back contact $s << D/L$ is satisfied, the open-circuit voltage is proportional to ln (tan $h$ $(t/L))^{-1}$. With reference to FIG. 2, the thickness $t$ of the solar cell varies across the cell from a maximum of $t_1 + t_2$ to a minimum of $t_2$. to demonstrate the advantages of the solar cell according to the invention, it is only necessary to analyze the two extreme cases of the thickness of the solar cell. For beginning of life, $t_1 + t_2 \approx L$ (beginning of life) so that $t/L \approx 1$ and tan $h$ 1 $\approx 0.8$. Thus, at beginning of life the solar cell may be considered to be a relatively thick cell, and the thicker portions of the cell will dominate the open-circuit voltage and keep its value high. Values of the argument of the hyperbolic tangent greatly exceeding 1 cause low open circuit voltages. See, again, my article entitled "Improve Theory of the Silicon p-n Junction Solar Cell." For the end of life in the thin portion where $t_2 = L$, tan $h$ 1 $\approx 0.8$ again while in the thick portion $t_1 + t_2 >> L$ so that the tan $h$ approaches unity. Thus, at the end of life the solar cell may be considered a relatively thin cell. As a result, the open-circuit voltage of the entire cell is highly insensitive to the radiation dose. Other advantages of the solar cell according to the invention are that it is easy to fabricate, not highly fragile as in the case of thin planar cells, and weighs substantially less than conventional solar cells.

It will be apparent that the embodiment shown is only exemplary in that other modifications can be made in construction and arrangement within the scope of the invention as defined in the appended claims.

I claim:

1. A method of using a radiation hardened solar cell in an extraterrestrial application comprising the steps of forming a plurality of V-grooves on the front surface of a semiconductor substrate of a first conductivity type, forming a thin layer of a second, opposite conductivity type layer thereupon to form a junction having the same topography as the front surface of the solar cell, highly doping the planar back surface of the solar cell to satisfy the conditions of $s << D/L$, where $s$ is the surface recombination velocity at the back surface, and D and L are the diffusion coefficient and the diffusion length, respectively, of minor carriers in the substrate, selecting the thickness of the solar cell optimized power output throughout a given design lifetime of said extraterrestrial application when said cell is subjected to extraterrestrial radiation such that the thickness of said cell measured from the planar back surface to the peaks of the V-grooves is approximately equal to the diffusion length L of minority carriers at the beginning of the design lifetime and the thickness of the solar cell measured from the planar back surface to the valleys of the V-grooves is approximately equal to the diffusion length L of minority carriers at the end of the design lifetime, and exposing said cell to extraterrestrial radiation.

2. A method of using a radiation hardened solar cell as recited in claim 7 wherein the semiconductor substrate is p-type silicon and the planar back surface is treated so as to make it $p^+$ to convert it into an electron reflecting region.

3. A method of using a radiation hardened solar cell as recited in claim 2 further comprising forming a front electrode of fine metal lines contacting the peaks between the V-grooves and a back electrode applied to the planar back surface of the solar cell.

4. A method of using a radiation hardened solar cell as recited in claim 2 wherein the depth to width ratio of the V-grooves is 0.7.

5. A method of using a radiation hardened solar cell as recited in claim 1 wherein the semiconductor substrate is silicon.

6. A method of using a radiation hardened solar cell in an extraterrestrial application for optimizing power output throughout a given design lifetime in said extraterrestrial application comprising the steps of: slicing a single crystal silicon substrate of a first conductivity type along the <100> plane to a thickness approximately equal to the diffusion length at beginning of said design lifetime for electrons in the silicon substrate, forming a mask comprising a plurality of spaced apart silicon dioxide stripes on the substrate exhibiting the <100> surface, treating the masked <100> surface with a preferential etching solution and allowing the etching to continue until self-stopping to form V-grooves between the silicon dioxide stripes with an angle of 70° and a depth to width ratio of 0.7, the resulting thickness measured from the back surface of the substrate to the valleys of the V-grooves selected to be approximately equal to the diffusion length of electrons in the silicon substrate at the end of design lifetime, thereafter diffusing a thin layer of a second, opposite conductivity type in the etched <100> surface to form a junction, and exposing said cell to extraterrestrial radiation.

* * * * *

UNITED STATES PATENT AND TRADEMARK OFFICE
CERTIFICATE OF CORRECTION

PATENT NO. : 4,135,950
DATED : January 23, 1979
INVENTOR(S) : Edmund S. RITTNER

It is certified that error appears in the above-identified patent and that said Letters Patent are hereby corrected as shown below:

Column 1, line 65 - delete "anf" insert -- and --

3, line 45 - delete "to" insert -- To --

Column 4, line 30 - delete "claim 7" insert -- claim 1 --

Signed and Sealed this

Twenty-second Day of May 1979

[SEAL]

Attest:

RUTH C. MASON
Attesting Officer

DONALD W. BANNER
Commissioner of Patents and Trademarks